United States Patent

Wensel

[11] Patent Number: 5,989,941
[45] Date of Patent: Nov. 23, 1999

[54] ENCAPSULATED INTEGRATED CIRCUIT PACKAGING

[75] Inventor: Richard W. Wensel, Boise, Id.

[73] Assignee: Micron Technology, Inc., Boise, Id.

[21] Appl. No.: 08/989,754

[22] Filed: Dec. 12, 1997

[51] Int. Cl.⁶ .......................... H01L 21/44; H01L 21/48; H01L 21/50

[52] U.S. Cl. .......................... 438/127; 438/106; 438/118; 438/121

[58] Field of Search .................................. 438/127, 106, 438/118, 121

[56] References Cited

U.S. PATENT DOCUMENTS 5,441,918  8/1995  Morisaki et al. .
5,696,033  12/1997  Kinsman .

Primary Examiner—Kevin M. Picardat
Assistant Examiner—D. Mark Collins
Attorney, Agent, or Firm—Trop, Pruner, Hu & Miles, P.C.

[57] ABSTRACT

An encapsulated integrated circuit package uses a heat dissipating dam which is secured about the die to the die support. A dam constrains the outward movement of liquid glob top material during the manufacturing process. In addition, the dam provides heat dissipating properties for the integrated circuit package and may improve the structural integrity of the package as well. The dam may be efficiently applied to the die support using automated techniques, such as adhesive tape bonding.

8 Claims, 3 Drawing Sheets

ENCAPSULATED INTEGRATED CIRCUIT PACKAGING

This invention relates generally to encapsulated integrating circuit packaging and particularly to techniques for forming "glob top" packages.

BACKGROUND OF THE INVENTION

Glob top packages use an encapsulating, electrically insulating member which is applied in liquid form and cured in place. It encapsulates the die and forms an insulating, protective layer over the top of the die. The glob top can in turn be covered by an optional lid. Conventionally, the liquid used to form the glob top is an epoxy encapsulant. Since it is applied in a liquid form, the encapsulant tends to spread outwardly before its cured. Therefore, dams may be utilized in connection with the glob top application to prevent overspreading of the material. Conventionally, glob top packages use polymer material as the dam.

While conventional packaging techniques are advantageous, there is a continuing need for more efficient, economical and effective packages for integrated circuit devices and particularly to such packages which improve the thermal characteristics and the structural rigidity of such packages. Because many modern integrated circuits develop considerable heat, it is important that this heat be dissipated or damage to the integrated circuit may occur. Heat can cause not only physical damage but can also affect the electrical performance of the die. In addition, especially with economical package configurations, the structural rigidity of the resulting package may be less than optimal. It would be desirable to provide economical packages with improved structural rigidity.

SUMMARY OF THE INVENTION

Embodiments of the present invention involve the use of a heat dissipating dam to form encapsulated packages. These packages may exhibit one or more of the following advantages: enhanced heat dissipation, improved structural rigidity, improved manufacturability.

In accordance with one aspect of the present invention, an integrated circuit package includes a die and a support structure. A die is secured to the support structure. A metallic member is secured to the structure, the member having a central opening. The die is situated within the central opening. An insulating material covers the die and fills the central opening.

In accordance with another aspect of the present invention, an integrated circuit package includes a die and a die mounting that supports the die. A heat dissipator is secured to the mounting around the die but spaced from the die. An encapsulant is configured over the die.

In accordance with still another aspect of the present invention, a method for forming an encapsulated integrated circuit package includes the step of securing a die to a die mounting. The die is wire bonded. A metal dam is secured around the die and the die is encapsulated with an encapsulant.

In accordance with yet another aspect of the present invention, a method of forming an encapsulated integrated circuit package includes the step of securing a die to a die mounting. A heat dissipating layer is secured to the mounting encircling the die. The heat dissipating layer is utilized as a dam to control the spread of an encapsulant applied over the die.

In accordance with but another aspect of the present invention, a method of forming dams for encapsulated integrated circuit packages includes the step of coating a film on one side with a layer of heat dissipating material. The film is coated on the other side with adhesive. A roll of the film is formed. The film is severed to form a dam for controlling the spreading of an encapsulant.

DESCRIPTION OF THE PREFERRED EMBODIMENTS

Figure 1:
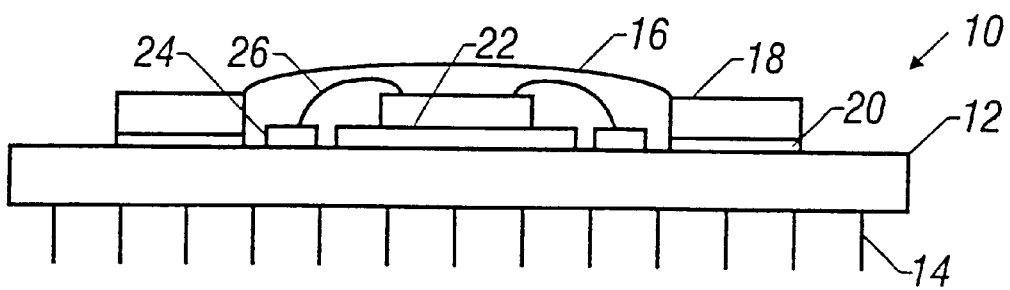
FIG. 1 is an enlarged cross-sectional view through one embodiment of the present invention.

Referring to the drawing wherein like reference characters are used for like parts throughout the several views, an integrated circuit package 10 is shown in FIG. 1. While the present invention is described in connection with the illustrated package, which could be a plastic pin grid array package, a variety of other well known packages may be utilized in connection with the present invention. Thus, it should be understood that the illustrated package is only one example of the potential applications of the present invention which is not tied to any particular package style. Other package styles, such as ball grid arrays and chip on board packages, for example, may use the present invention.

The package 10 includes a substrate or supporting structure 12, a plurality of contacts or pins 14 extending from the substrate 12 and a glob top 16. A glob top heat dissipating dam 18 defines the shape of the glob top 16 and may be adhesively secured to the top of the substrate 12 by an adhesive layer 20. A die 22 is also secured to the substrate 12 using conventional techniques. A metallized circuit pattern 24, such as a lead frame, is secured to the substrate 12 and is electrically connected to the die 22 by way of wires 26 using conventional wire bonding technology, for example.

Figure 2:
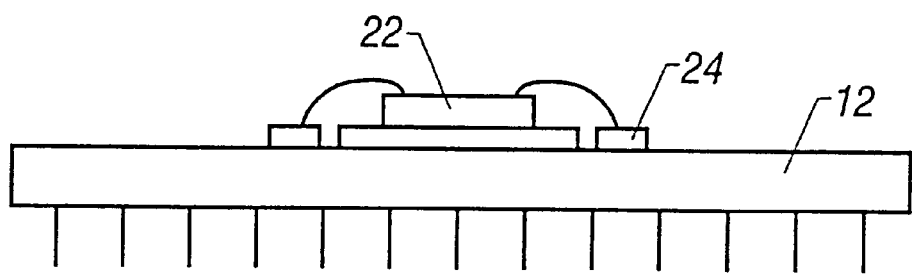
FIG. 2 is an enlarged cross-sectional view showing the embodiment of FIG. 1 in the course of manufacture.
Figure 3:
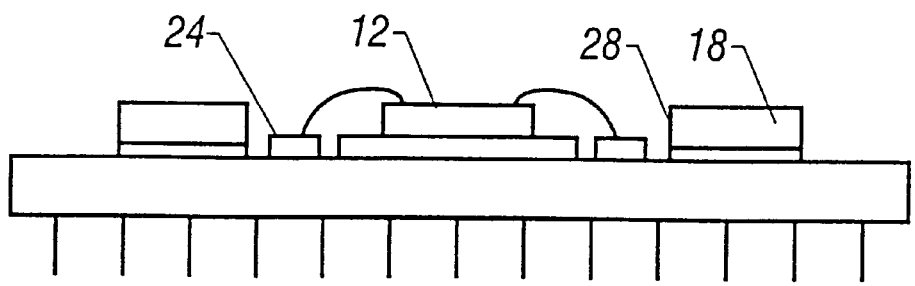
FIG. 3 is an enlarged cross-sectional view showing a subsequent step in the course of manufacturing the package shown in FIG. 1.

The formation of the package shown in FIG. 1 is illustrated in FIGS. 2 and 3. Initially, the die 22 is secured to the substrate 12. A metallized circuit pattern 24 is also secured to the substrate 12 and wire bonding is utilized to connect the pattern 24 to the die 22 in a conventional fashion.

Figure 4:
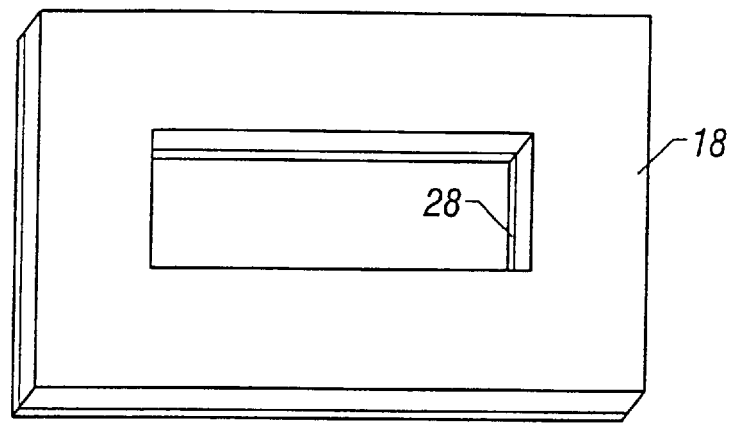
FIG. 4 is an enlarged perspective view of the heat dissipating dam shown in FIG. 1.

Thereafter, a metallic dam 18 is secured with its central opening 28 encircling but spaced from the die 12 and the pattern 24. As shown in FIG. 4, the heat dissipating dam 18 may formed of a metal plate with the central opening 28 formed therein and an adhesive layer secured to one face thereof. Alternatively, the dam 18 may be formed of four abutting metallic strips (not shown) forming a rectangular shape.

Conveniently, the adhesive may be adhesive tape such as double sided lead on chip tape which may be applied using automated techniques. In this way, the adhesive tape can be quickly and easily applied to the dam 18 and the dam 18 may be readily secured to the substrate or other package supporting structure 12.

Figure 5:
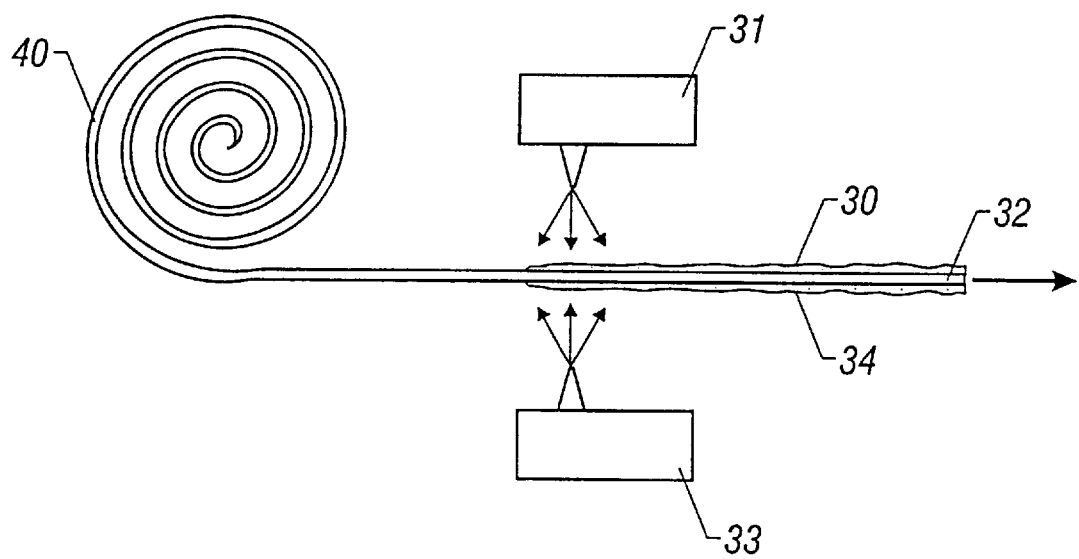
FIG. 5 is an enlarged perspective view showing a technique for forming the dams.

As shown in FIG. 5, in one embodiment, a heat conductive layer 30 may be coated using an applicator 31 on polymeric film 32. The uncovered film side may then be coated using an applicator 33 with adhesive 34. The dams 18 may be severed from a roll 40 of material in a continuous fashion and applied to a die. The coating may be metallic or non-metallic heat dissipating material.

With the package in the condition shown in FIG. 3, the glob top may be applied using liquid epoxy or other conventional materials. These materials are applied into the central opening of the dam 28. The dam constrains the outward movement of the encapsulant, resulting in the formation of the glob top 16.

By making the dam 18 of a metallic material such as copper, it can also provide important heat dissipation properties. The rigidity of the metallic dam 18 also helps to prevent package warpage. Thus, it will be appreciated that important advantages, including heat dissipation and improved structural rigidity, may be achieved with an element which also helps to form the glob top 16. Therefore, it is believed that the structure provides an advantageous arrangement which facilitates and improves integrated circuit packaging technology.

Figure 6:
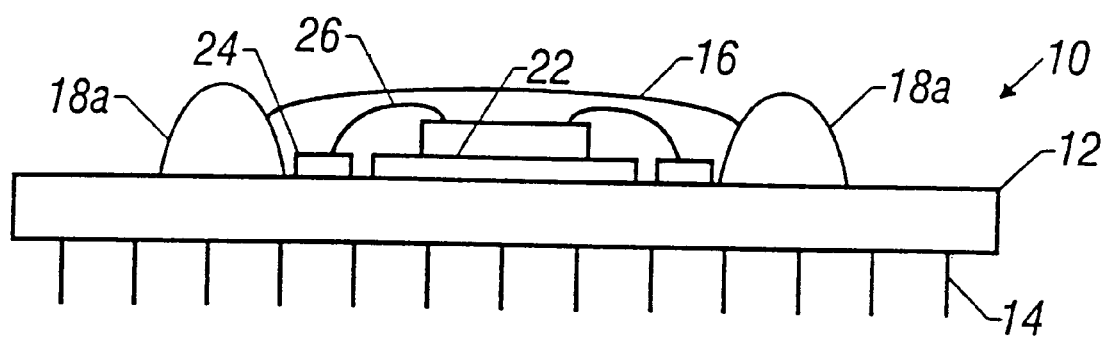
FIG. 6 is an enlarged cross-sectional view through another embodiment.

Alternatively, a heat conductive dam 18a may be formed using a robot controlled syringe, as shown in FIG. 6, to apply a bead of heat conductive material, such as a silver paste or silver filled epoxy material. Also, thermally conductive, electrically insulating materials may be applied to form a dam 18 using a syringe technique, for example. The insulating nature of such materials avoids possible shorting. Useful insulators include aluminum oxide or boron nitride.

While the present invention has been described with respect to a limited number of preferred embodiments, those skilled in the art will appreciate numerous modifications and variations therefrom. It is intended that the appended claims cover all such modifications and variations as fall within the true and spirit and scope of the present invention.

What is claimed is:

1. A method of forming an encapsulated packaging comprising the steps of:
    securing a die to a die mounting;
    wire bonding said die;
    coating a metal on one side of a film;
    applying adhesive to the other side;
    forming a central aperture in said film to form a dam;
    securing the metallic dam around said die; and
    encapsulating said die with an encapsulant.

2. The method of claim 1 including applying an adhesive to said dam and adhesively securing said dam to said mounting around said die.

3. The method of claim 2 including the step of applying adhesive tape to said dam to adhesively secure said dam to said mounting.

4. The method of claim 3 including the step of dissipating heat through said metallic dam.

5. The method of claim 4 including the step of constraining said encapsulant using said dam.

6. The method of claim 1 including the steps of forming a roll of metal coated film, unwinding said roll, and severing dams from said roll.

7. A method of forming dams for encapsulated integrated circuit packages comprising the steps of:
    coating a film on one said with a layer of heat dissipating material;
    coating the other side of said film with adhesive;
    forming a roll of said film; and
    severing sections of said film to form dams for controlling the spreading of an encapsulant.

8. The method of claim 7 including coating the film with a metallic layer.

* * * * *